United States Patent
Kim et al.

(10) Patent No.: US 8,952,370 B2
(45) Date of Patent: Feb. 10, 2015

(54) ORGANIC LIGHT EMITTING DISPLAY PANEL AND METHOD OF MANUFACTURING THE SAME

(71) Applicant: Samsung Display Co., Ltd., Yongin, Gyeonggi-do (KR)

(72) Inventors: Jae Jung Kim, Yongin (KR); Joon Young Park, Yongin (KR); Hongkyun Ahn, Yongin (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 13/938,771

(22) Filed: Jul. 10, 2013

(65) Prior Publication Data

US 2014/0183461 A1   Jul. 3, 2014

(30) Foreign Application Priority Data

Dec. 28, 2012  (KR) .................. 10-2012-0156631

(51) Int. Cl.
*H01L 51/00* (2006.01)
*H01L 51/56* (2006.01)
*H01L 27/32* (2006.01)
*H01L 51/52* (2006.01)

(52) U.S. Cl.
CPC ............ *H01L 51/56* (2013.01); *H01L 27/3211* (2013.01); *H01L 51/5265* (2013.01)

USPC ..................................... 257/40; 257/E51.022

(58) Field of Classification Search
USPC .................... 257/79, 82, 88, 90, 40, E51.022
See application file for complete search history.

(56) References Cited

U.S. PATENT DOCUMENTS

| 6,288,486 | B1 | 9/2001 | Tsuruoka et al. |
| 6,541,130 | B2* | 4/2003 | Fukuda .......................... 428/690 |
| 8,390,761 | B2* | 3/2013 | Oda ................... 349/61 |
| 2012/0138904 | A1 | 6/2012 | Shimizu et al. |

FOREIGN PATENT DOCUMENTS

| JP | 11-067454 | 3/1999 |
| KR | 10-2010-0072265 | 6/2010 |

* cited by examiner

*Primary Examiner* — Quoc Hoang
(74) *Attorney, Agent, or Firm* — Knobbe Martens Olson & Bear LLP

(57) ABSTRACT

An organic light emitting display panel includes a first pixel and a second pixel respectively disposed in first and second light emitting areas. A portion of a first hole transport layer and a portion of a first light emitting layer of the first pixel are disposed in the second light emitting area. The portions of the first hole transport layer and the first light emitting layer overlap a second hole transport layer and a second light emitting layer, which are successively stacked. The second hole transport layer and the second light emitting layer block holes and electrons from moving to the portion of the first light emitting layer.

14 Claims, 19 Drawing Sheets

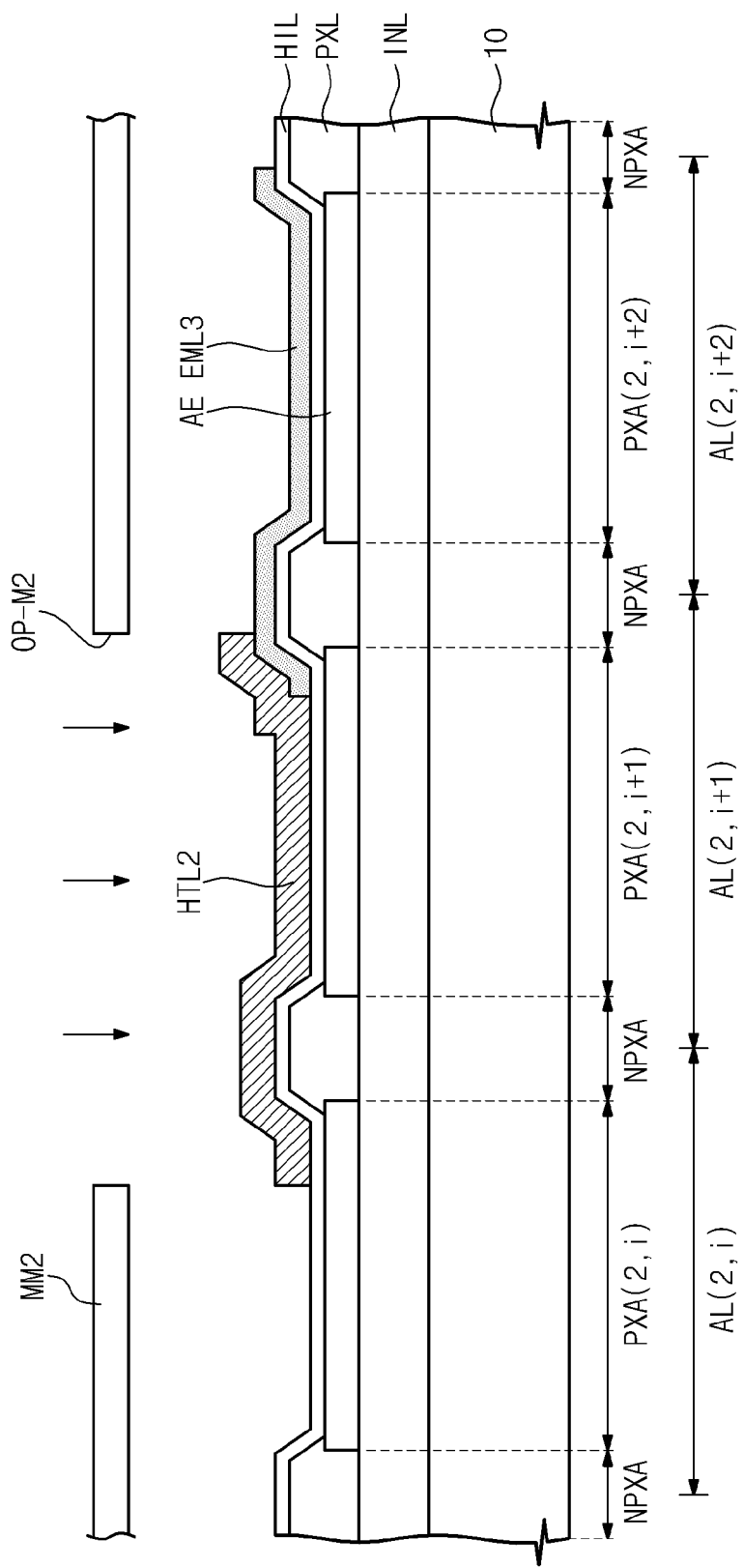

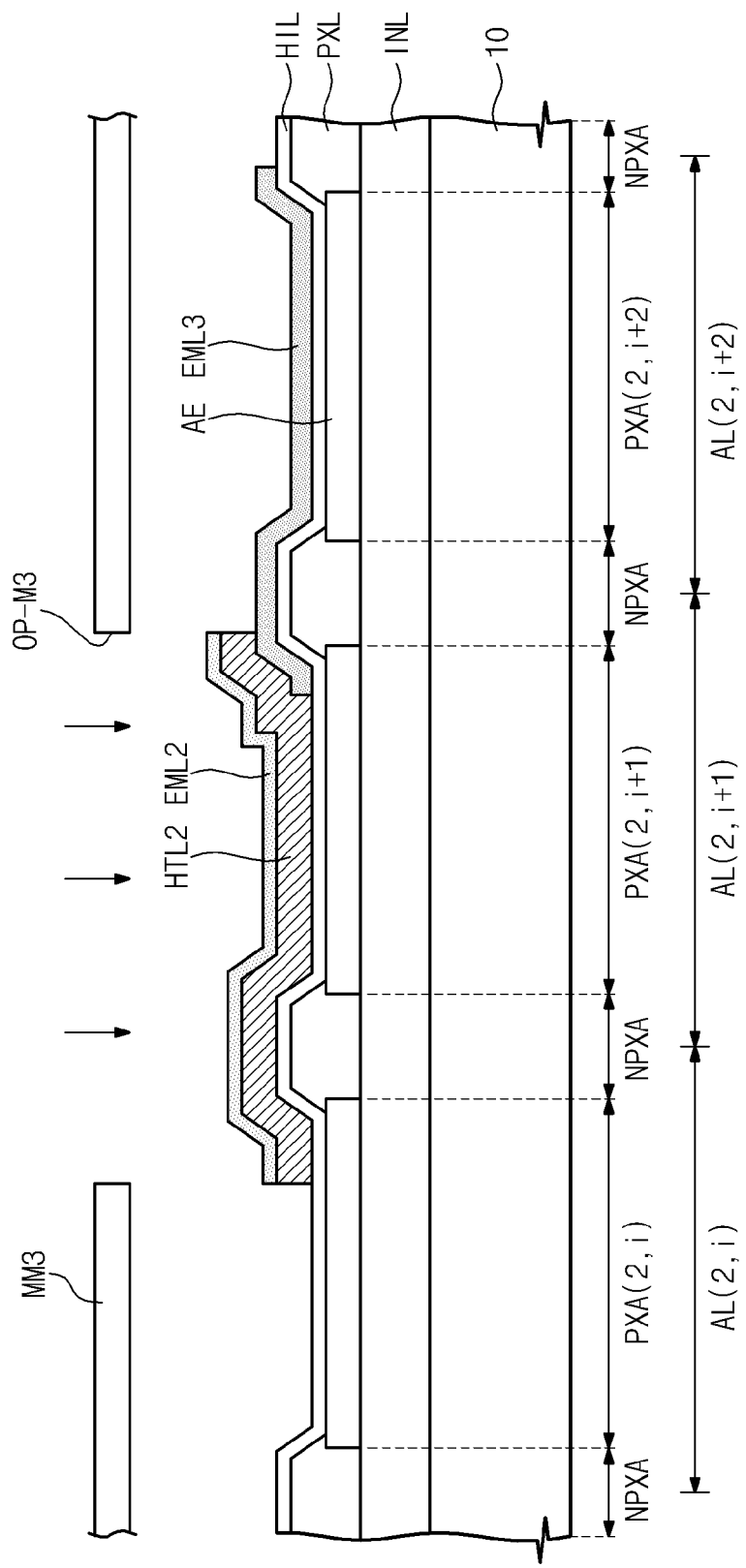

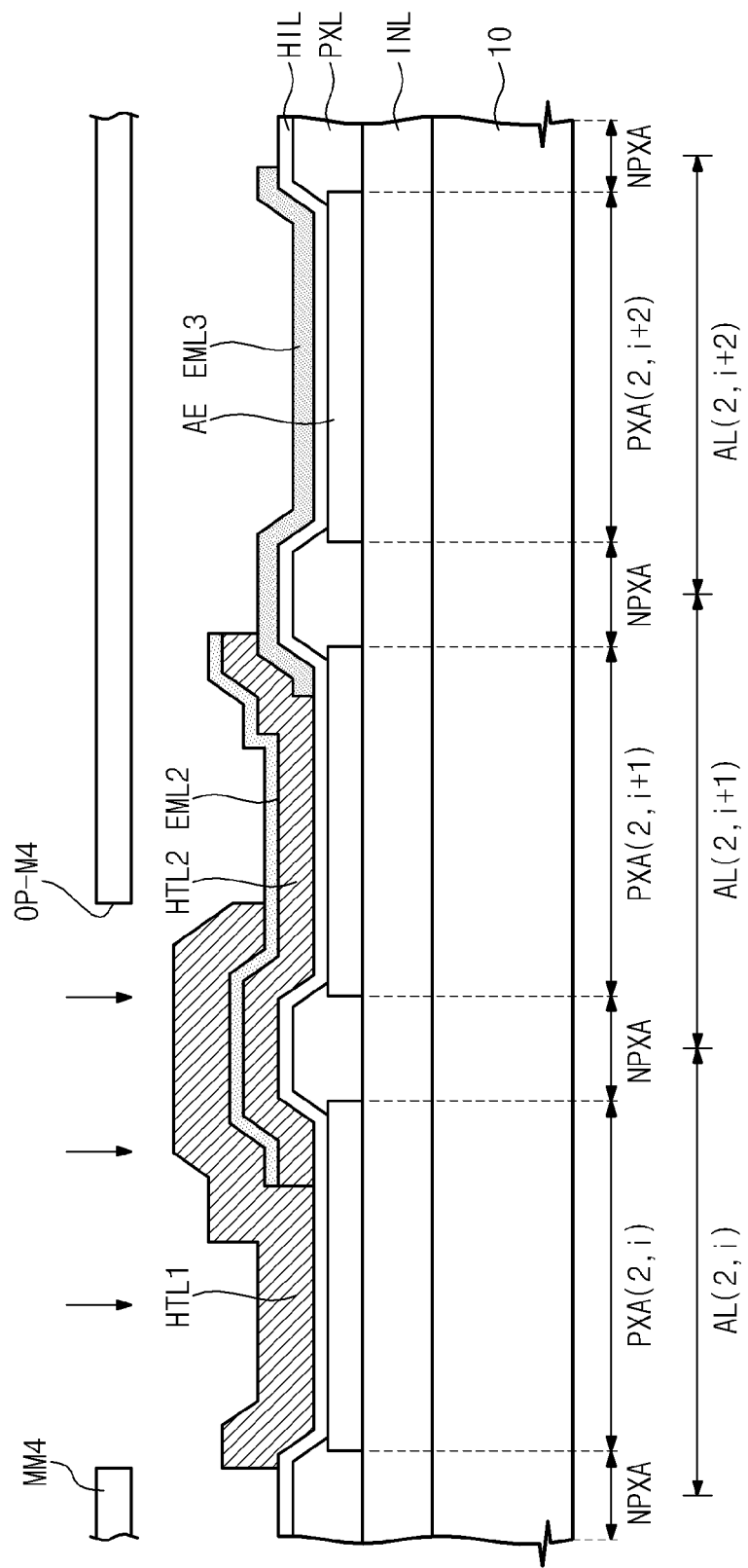

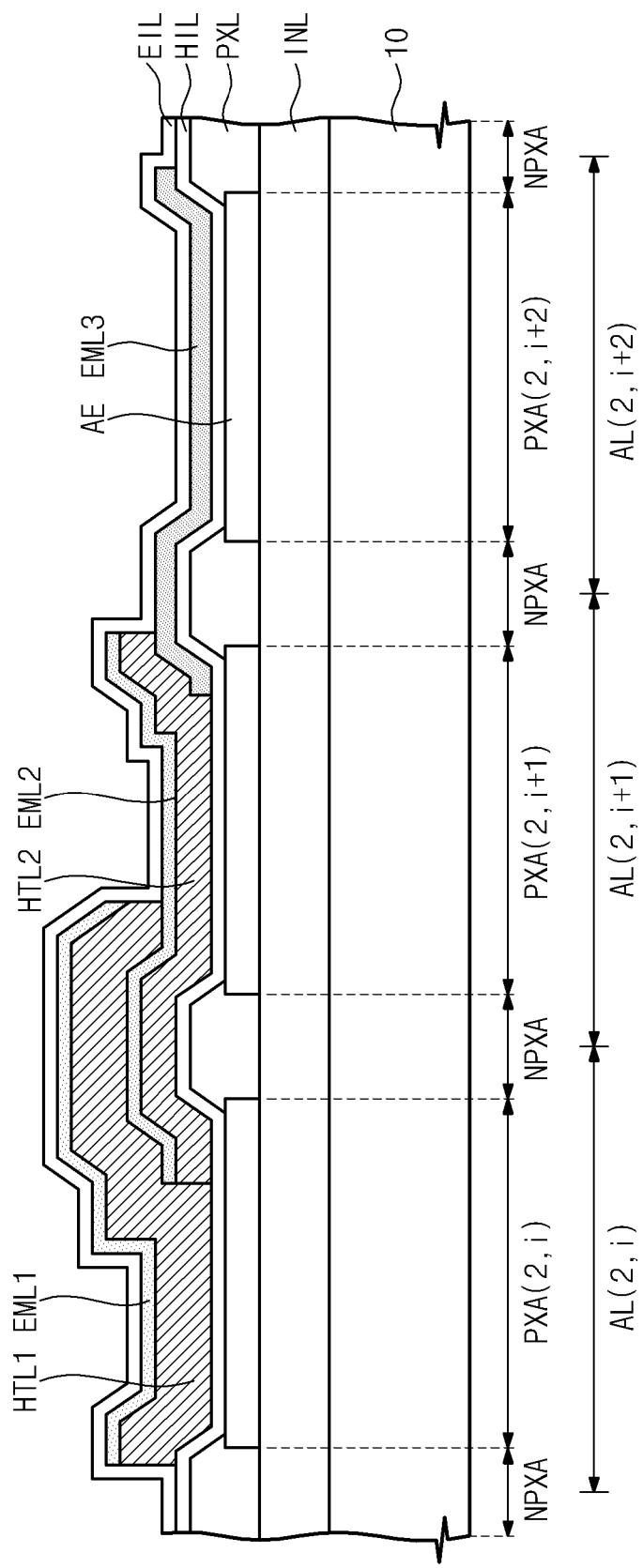

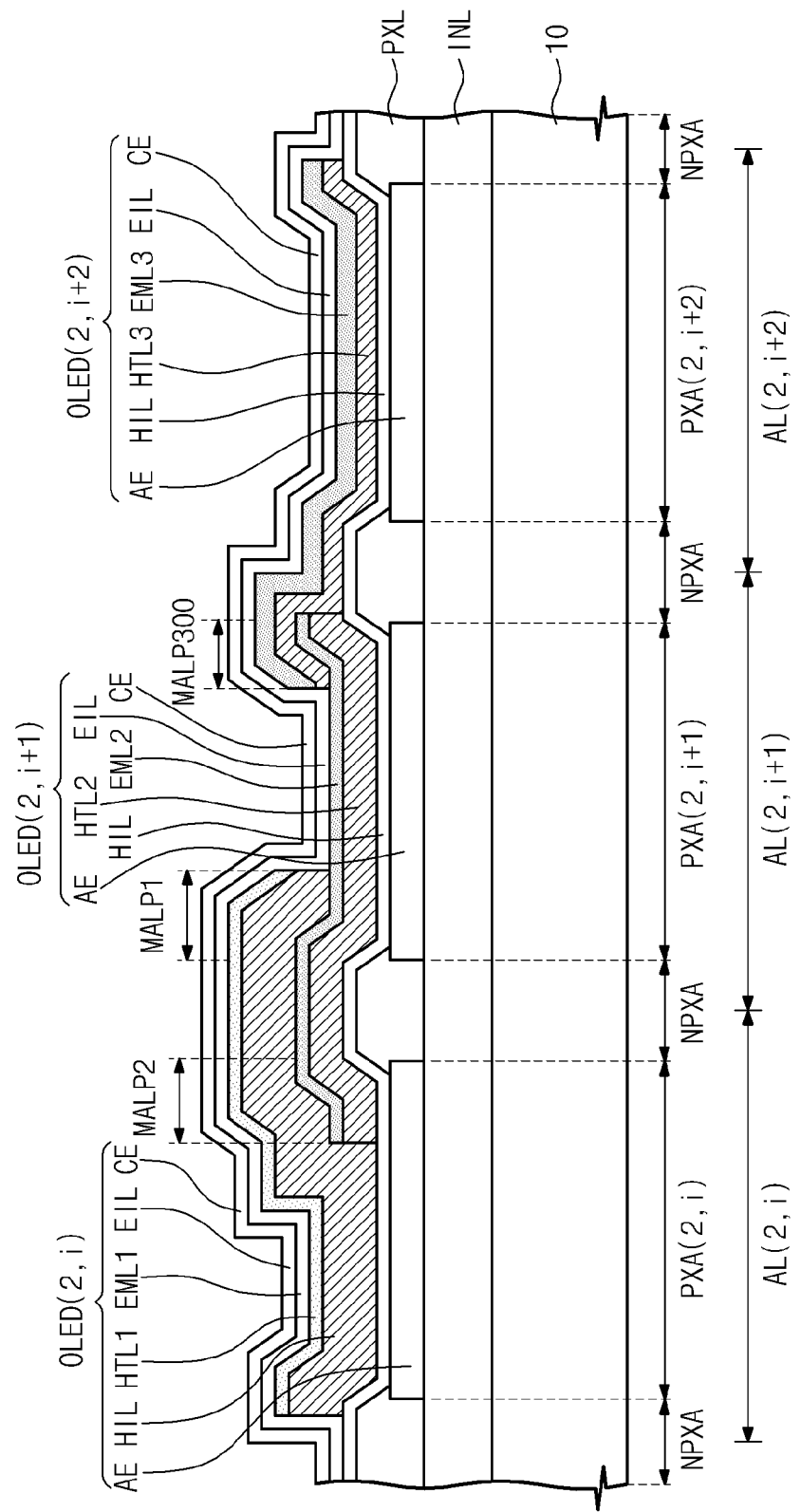

ORGANIC LIGHT EMITTING DISPLAY PANEL AND METHOD OF MANUFACTURING THE SAME

CROSS-REFERENCE TO RELATED APPLICATIONS

This U.S. non-provisional patent application claims priority under 35 U.S.C. §119 of Korean Patent Application No. 10-2012-0156631, filed on Dec. 28, 2012, the contents of which are hereby incorporated by reference.

BACKGROUND

1. Field

The present disclosure relates to an organic light emitting display panel having improved display quality and a method of manufacturing the organic light emitting display.

2. Description of the Related Technology

In general, an organic light emitting display includes an organic light emitting display panel and a driver that controls the organic light emitting display panel. The organic light emitting display panel includes a plurality of pixels. Each pixel includes an organic light emitting diode.

The organic light emitting diode generally includes two electrodes and an organic light emitting layer disposed between the two electrodes. The two electrodes are classified as an anode electrode and a cathode electrode according to a level of voltage applied to the two electrodes.

The organic light emitting display panel includes a plurality of light emitting areas and a non-light emitting area surrounding the light emitting areas. The organic light emitting diodes are arranged in the light emitting areas, respectively.

The organic light emitting diodes arranged in portions of the light emitting areas respectively include organic light emitting layers formed of a different material from that of the organic light emitting diodes arranged in the other portions of the light emitting areas. When the organic light emitting display panel is manufactured, the organic light emitting layers of the organic light emitting diodes arranged in the portions of the light emitting areas are interfered by the other portions of the light emitting areas.

SUMMARY OF CERTAIN INVENTIVE ASPECTS

The present disclosure provides an organic light emitting display panel capable of preventing colors from mixing.

The present disclosure provides a method of manufacturing the organic light emitting display panel.

Embodiments provide an organic light emitting display panel including a base substrate that includes a plurality of light emitting areas and a non-light emitting area surrounding the light emitting areas. The organic light emitting display panel includes a first electrode, a second electrode, a hole injection layer, a first hole transport layer, a second hole transport layer, a first light emitting layer, a second light emitting layer, and a common electrode.

The first electrode is disposed in a first light emitting area of the plurality of light emitting areas and the second electrode is disposed in a second light emitting area of the plurality of light emitting areas. The second light emitting area is adjacent to the first light emitting area. The hole injection layer contacts the first electrode and the second electrode and is disposed to overlap with the first and second light emitting areas and the non-light emitting area. The first hole transport layer is disposed over the hole injection layer disposed in the first light emitting area. The first light emitting layer is disposed over the first hole transport layer contacting the first hole transport layer.

The second hole transport layer is disposed over the hole injection layer disposed in the second light emitting area, and the second light emitting layer is disposed over the second hole transport layer contacting the second hole transport layer. The common electrode is disposed on the first light emitting layer and the second light emitting layer to overlap with the plurality of light emitting areas and the non-light emitting area.

A portion of the first hole transport layer and a portion of the first light emitting layer are disposed over the hole injection layer in the second light emitting area. A portion of the second hole transport layer and a portion of the second light emitting layer are disposed over the first light emitting layer in the first light emitting area.

The organic light emitting display panel further includes a third electrode disposed in a third light emitting area of the plurality of light emitting areas, the third light emitting area adjacent to the first light emitting area, the third electrode disposed between the base substrate and the hole injection layer in the third light emitting area and a third light emitting layer disposed over the hole injection layer in the third light emitting area.

The portion of the third light emitting layer contacts the hole injection layer in the first light emitting area. Another portion of the first hole transport layer and another portion of the first light emitting layer are disposed on the third light emitting layer.

The organic light emitting display panel further includes a third hole transport layer disposed between the third light emitting layer and the hole injection layer in the third light emitting area, and the third hole transport layer contacts the third light emitting layer.

A portion of the third hole transport layer contacts the hole injection layer in the first light emitting area, and a portion of the third light emitting layer contacts the portion of the third hole transport layer.

Another portion of the first hole transport layer and another portion of the first light emitting layer are disposed over the third light emitting layer.

A portion of the third hole transport layer contacts the first light emitting layer and a portion of the third light emitting layer overlaps the portion of the third hole transport layer.

Another portion of the first hole transport layer contacts the hole injection layer in the third light emitting area, and another portion of the first light emitting layer contacts the another portion of the third light emitting layer.

Embodiments of the inventive concept provide a method of manufacturing an organic light emitting display panel including forming a first electrode, a second electrode, and a third electrode on a base substrate including a first light emitting area, a second light emitting area, a third light emitting area, and a non-light emitting area surrounding the first, second, and third light emitting areas to allow the first, second, and third electrodes to be disposed to respectively correspond to the first, second, and third light emitting areas, forming a hole injection layer on the base substrate such that the hole injection layer contacts the first, second, and third electrodes, forming a first hole transport layer overlapped with the hole injection layer in the first light emitting area and partially making contact with the hole injection layer in the second light emitting area, forming a first light emitting layer on the first hole transport layer, forming a second hole transport layer overlapped with the hole injection layer in the second light emitting area and partially making contact with the first light emitting layer, forming a second light emitting layer on the second hole transport layer, and forming a common electrode on the base substrate to overlap with the first light emitting layer and the second light emitting layer.

According to the above, although the portion of the first hole transport layer and the portion of the first light emitting layer are disposed over the second light emitting area, the portion of the first light emitting layer does not generate the light since recombination between holes and electrons does not occur in the portion of the first light emitting layer. Thus, only the light corresponding to the second light emitting layer is generated in the second light emitting area, thereby preventing colors of lights from being mixed with each other while the light emitting layers emit the lights.

According to the method of manufacturing the organic light emitting display panel, although the hole injection layer and the light emitting layer are misaligned with respect to corresponding light emitting area, the colors of lights may be prevented from being mixed with each other while the light emitting layers emit the lights.

BRIEF DESCRIPTION OF THE DRAWINGS

The above and other advantages of the present disclosure will become readily apparent by reference to the following detailed description when considered in conjunction with the accompanying drawings wherein:

FIGS. 8A to 8J are cross-sectional views showing a method of manufacturing an organic light emitting display panel according to an embodiment of the present disclosure;

FIG. 10 is a cross-sectional view showing an organic light emitting display panel according to an embodiment of the present disclosure.

DETAILED DESCRIPTION OF CERTAIN INVENTIVE EMBODIMENTS

Figure 1:
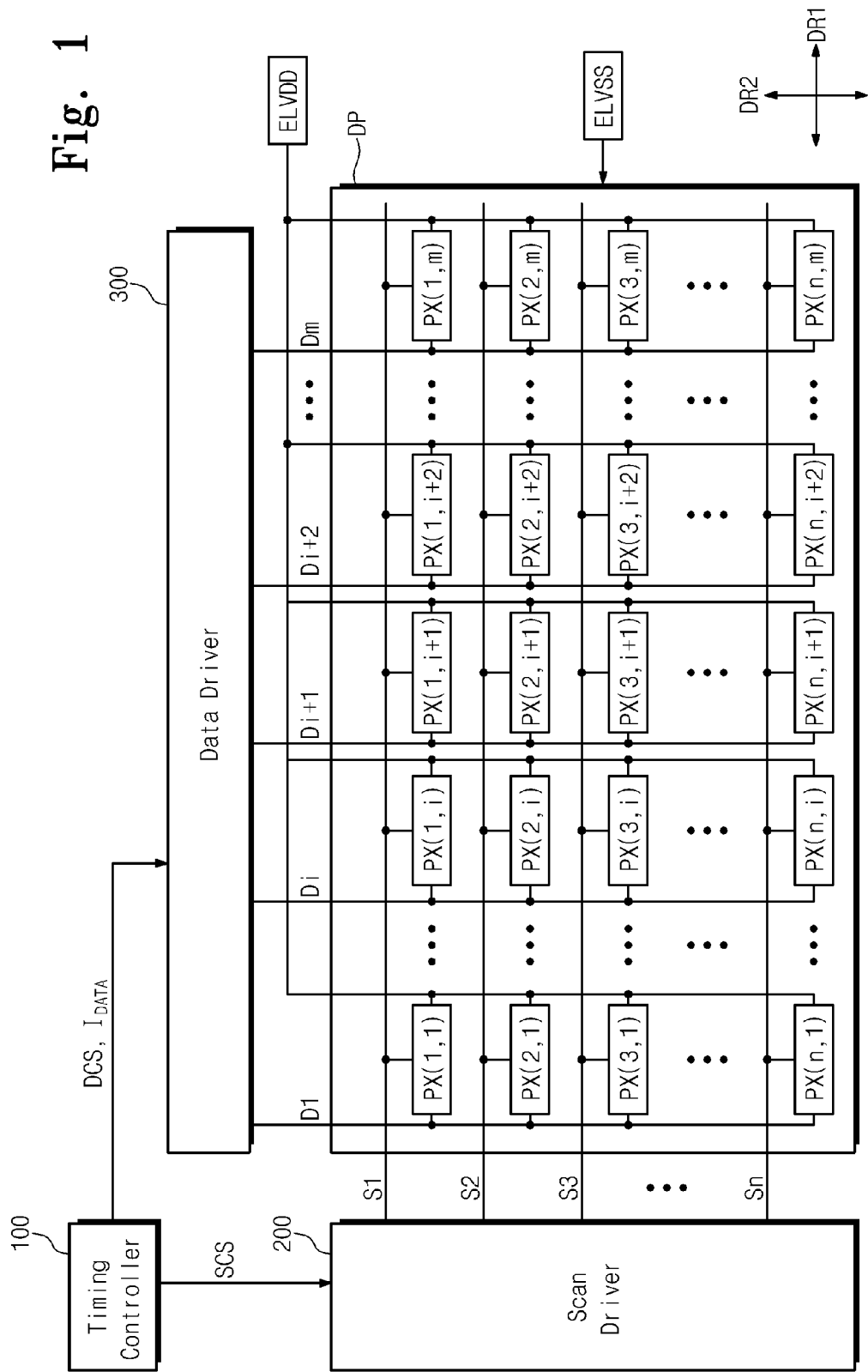
FIG. 1 is a block diagram showing an organic light emitting display according to an embodiment of the present disclosure.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers generally refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the present invention will be explained in detail with reference to the accompanying drawings.

Figure 2:
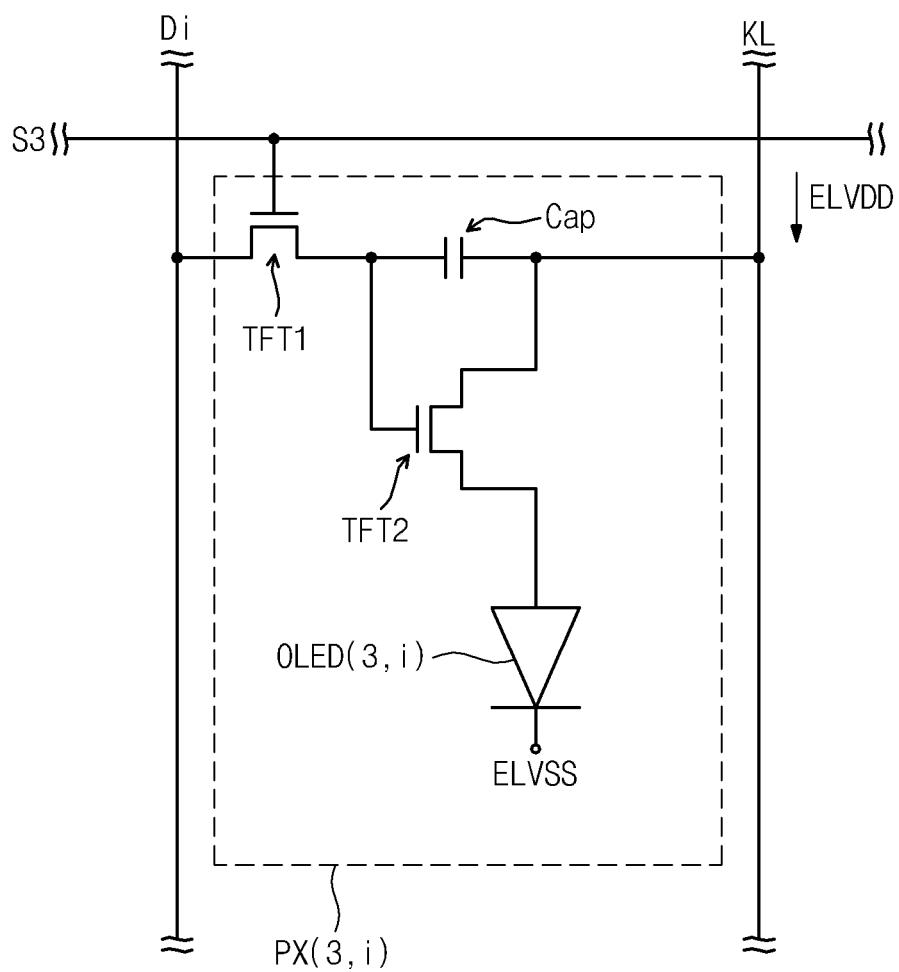
FIG. 2 is an equivalent circuit diagram showing a pixel according to an embodiment of the present disclosure.

FIG. 1 is a block diagram showing an organic light emitting display according to an embodiment of the present disclosure and FIG. 2 is an equivalent circuit diagram showing a pixel according to an embodiment of the present disclosure.

Referring to FIG. 1, the organic light emitting display includes an organic light emitting display panel DP, a timing controller 100, a scan driver 200, and a data driver 300.

The organic light emitting display panel DP includes a base substrate (not shown), a plurality of scan lines S1 to Sn disposed on the base substrate, a plurality of data lines D1 to Dm, and a plurality of pixels PX(1, 1) to PX(n, m) each being connected to a corresponding scan line of the scan lines S1 to Sn and a corresponding data line of the data lines D1 to Dm.

The scan lines S1 to Sn are extended in a first direction DR1 and arranged in a second direction DR2 crossing the first direction DR1. The data lines D1 to Dm are insulated from the scan lines S1 to Sn while crossing the scan lines S1 to Sn. The data lines D1 to Dm are extended in the second direction DR2 and arranged in the first direction DR1.

The organic light emitting display panel DP receives a first source voltage ELVDD and a second source voltage ELVSS from an external source (not shown). The pixels PX(1, 1) to PX(n, m) are turned on in response to scan signals, respectively. Each of the pixels PX(1, 1) to PX(n, m) receives the first and second source voltages ELVDD and ELVSS and generates light in response to a corresponding data signal. The first source voltage ELVDD generally has a level higher than that of the second source voltage ELVSS.

Each of the pixels PX(1, 1) to PX(n, m) includes at least one transistor, at least one capacitor, and an organic light emitting diode. Each of the pixels PX(1, 1) to PX(n, m) has the equivalent circuit diagram as a pixel PX(3, i) shown in FIG. 2, but it should not be limited thereto or thereby.

As shown in FIG. 2, the pixel PX(3, i) includes a first transistor TFT1, a second transistor TFT2, a capacitor Cap, and an organic light emitting diode OLED(3, i). The first transistor TFT1 includes the control electrode connected to a third scan line S3, an input electrode connected to the i-th data line Di, and an output electrode. The first transistor TFT1 outputs the data signal applied to the i-th data line Di in response to the scan signal applied to the third scan line S3.

The capacitor Cap includes a first electrode connected to the first transistor TFT1 and a second electrode applied with the first source voltage ELVDD. The capacitor Cap is charged with electric charges corresponding to a difference between a voltage corresponding to the data signal from the first transistor TFT 1 and the first source voltage ELVDD.

The second transistor TFT2 includes a control electrode connected to the output electrode of the first transistor TFT 1 and the first electrode of the capacitor Cap, an input electrode applied with the first source voltage ELVDD, and an output electrode. The output electrode of the second transistor TFT2 is connected to the organic light emitting diode OLED(3, i). The second transistor TFT2 controls a driving current flowing through the organic light emitting diode OLED(3, i) corresponding to the electric charges charged in the capacitor Cap.

The organic light emitting diode OLED(3, i) includes a first electrode (not shown) connected to the second transistor TFT2 and a second electrode (not shown) applied with the second source voltage ELVSS. In addition, the organic light emitting diode OLED(3, i) includes an organic light emitting layer disposed between the first and second electrodes thereof. The organic light emitting diode OLED(3, i) emits the light during a turn-on period of the second transistor TFT2.

Referring back to FIG. 1, the timing controller 100 receives image signals (not shown) and converts the image signals to image data $I_{DATA}$ appropriate to an operation mode of the organic light emitting display panel DP. The timing controller 100 outputs the image data $I_{DATA}$ and scan driving control signal SCS and data driving control signal DCS.

The scan driver 200 receives the scan driving control signal SCS from the timing controller 100. The scan driver 200 generates a plurality of scan signals in response to the scan driving control signal SCS. The scan signals are sequentially applied to the scan lines S1 to Sn.

The data driver 300 receives the data driving control signal DCS and the image data $I_{DATA}$ from the timing controller 100. The data driver 300 generates a plurality of data signals on the basis of the data driving control signal DCS and the image data $I_{DATA}$. The data signals are applied to the data lines D1 to Dm.

Figure 3:
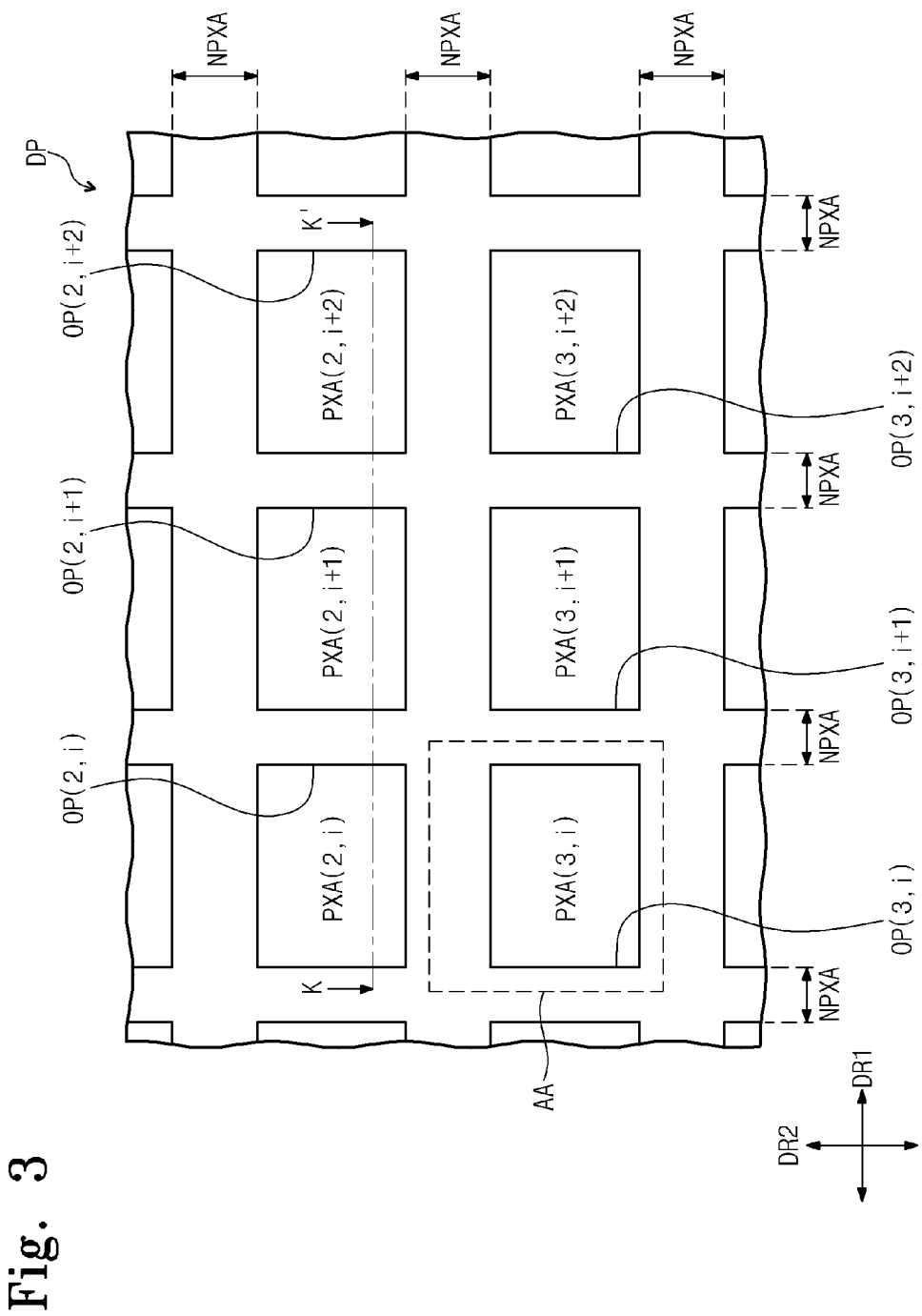
FIG. 3 is a plan view showing a portion of the organic light emitting display panel shown in FIG. 1.

FIG. 3 is a plan view showing a portion of the organic light emitting display panel shown in FIG. 1.

Referring to FIG. 3, the organic light emitting display panel DP includes light emitting areas PXA(2, i) to PXA(3, i+2) and a non-light emitting area NPXA surrounding the light emitting areas PXA(2, i) to PXA(3, i+2).

The light emitting areas PXA(2, i) to PXA(3, i+2) include the organic light emitting diodes of the corresponding pixels PX(2, i) to PX(3, i+2), respectively. The non-light emitting area NPXA includes the transistors, the capacitors, the scan lines, and the data lines of the pixels PX(2, i) to PX(3, i+2).

A pixel definition layer PXL provided with a plurality of opening portions OP(2, i) to OP(3, i+2) is disposed in the non-light emitting areas NPXA. The light emitting areas PXA (2, i) to PXA(3, i+2) are defined by the opening portions OP(2, i) to OP(3, i+2).

Figure 4:
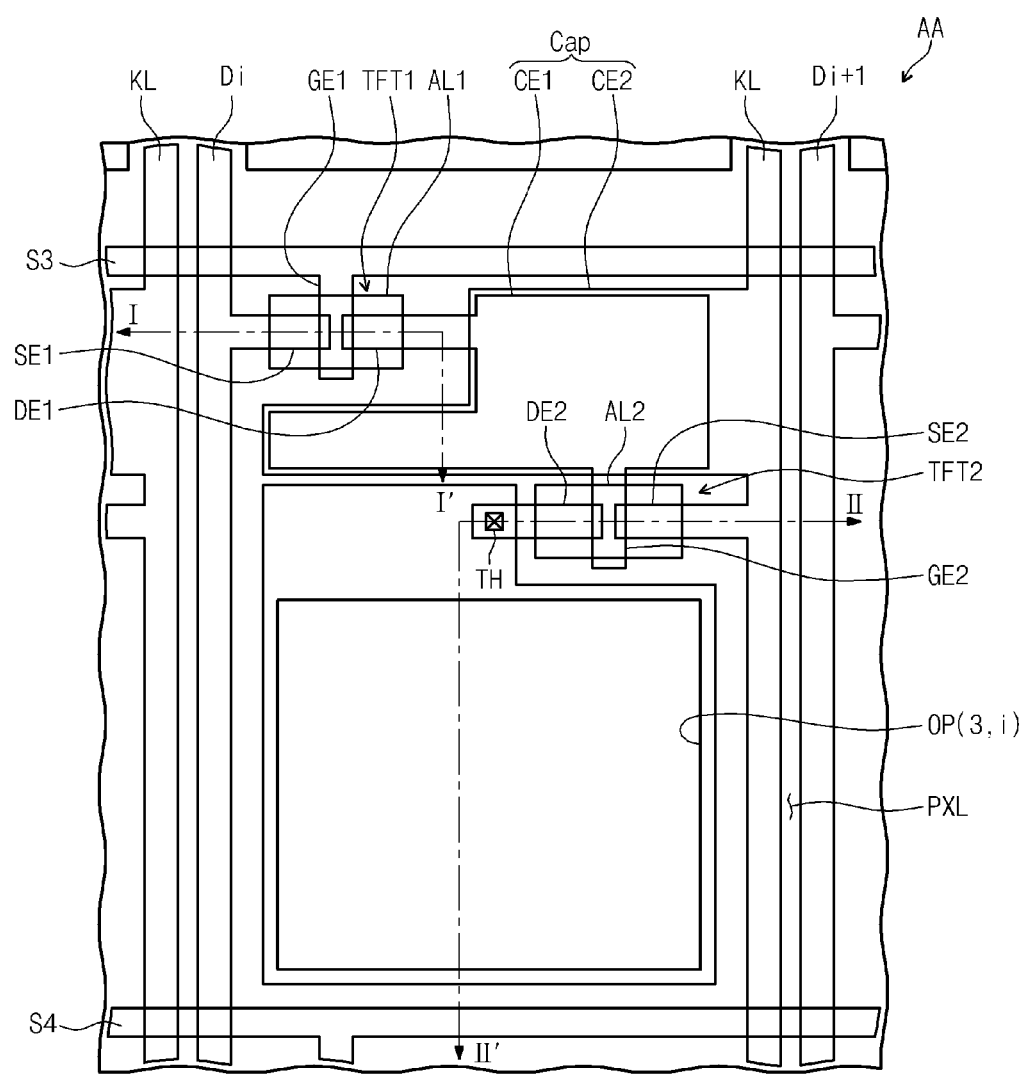
FIG. 4 is a layout showing a pixel arranged in a portion AA of FIG. 3.
Figure 5:
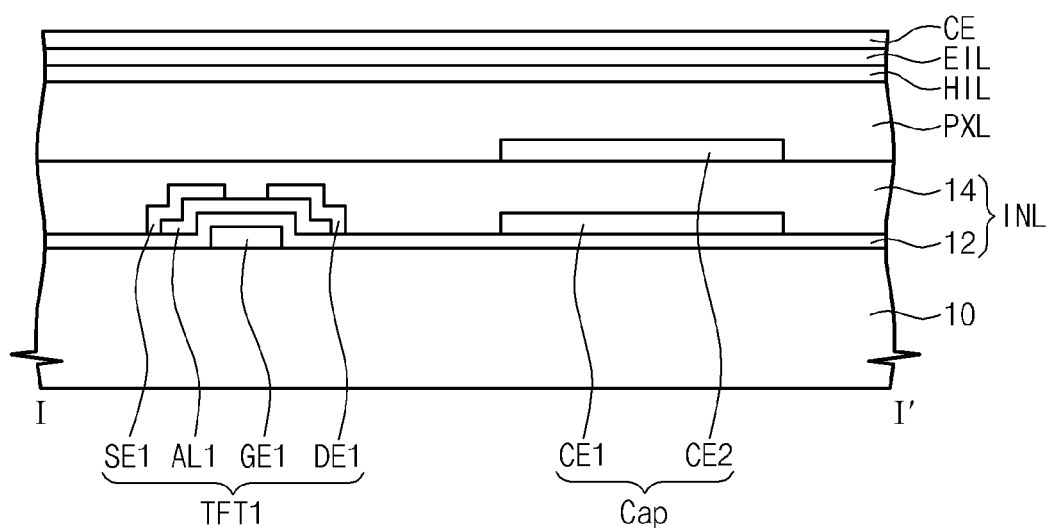
FIG. 5 is a cross-sectional view taken along a line I-I' of FIG. 4.
Figure 6:
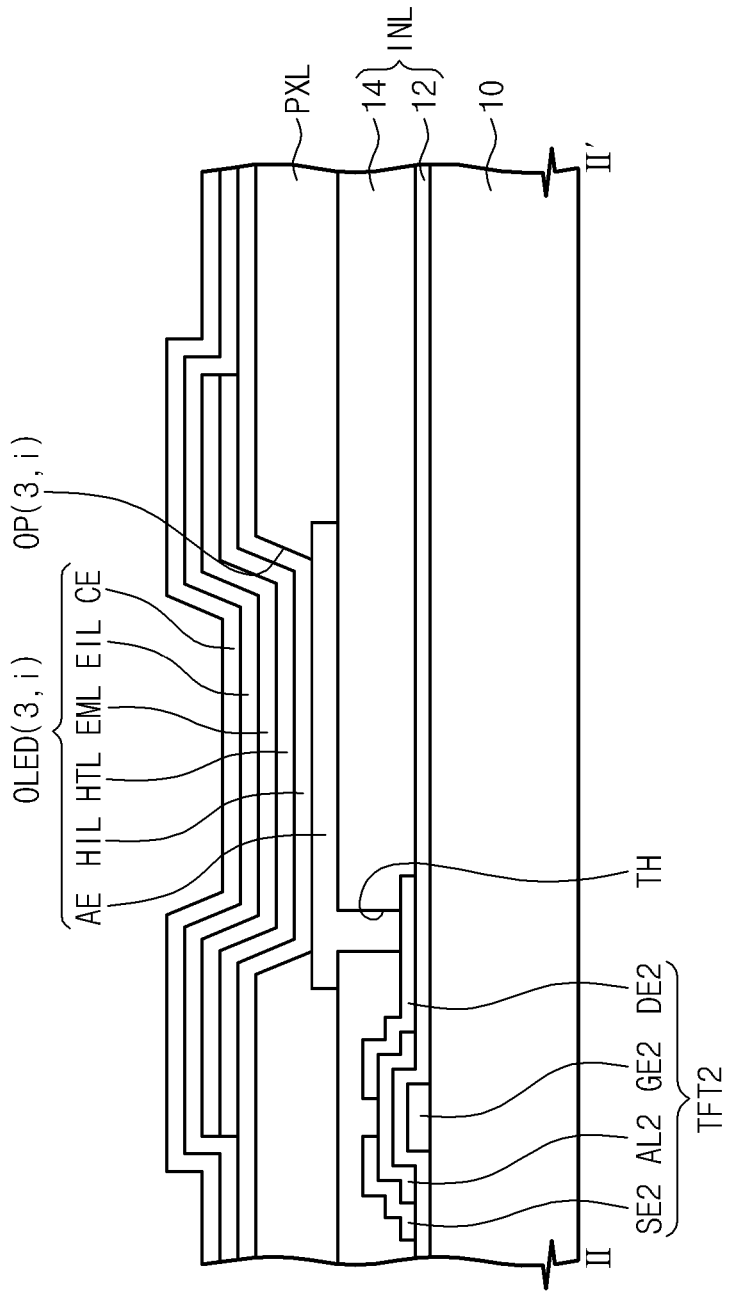
FIG. 6 is a cross-sectional view taken along a line II-II' of FIG. 4.

FIG. 4 is a layout showing a pixel arranged in a portion AA of FIG. 3, FIG. 5 is a cross-sectional view taken along a line I-I' of FIG. 4, and FIG. 6 is a cross-sectional view taken along a line II-IF of FIG. 4. FIGS. 4 to 6 shows the layout of the pixel corresponding to the equivalent circuit diagram shown in FIG. 2, and a portion of elements for the organic light emitting diode is omitted.

The third scan line S3 and the i-th data line Di are disposed on the base substrate 10 to be insulated from each other. In addition, a source voltage line KL applied with the first source voltage ELVDD is disposed on the base substrate 10. The source voltage line KL may be disposed on the same layer as the i-th data line Di.

Referring to FIGS. 4 and 5, the control electrode GE1 (hereinafter, referred to as a first control electrode) of the first transistor TFT1 is branched from the third scan line S3. A first insulating thin layer 12 is disposed on the base substrate 10 to cover the third scan line S3. The first insulating thin layer 12 includes an organic layer and/or an inorganic layer.

A semiconductor layer AL1 (hereinafter, referred to as a first semiconductor layer) of the first transistor TFT1 is disposed on the first control electrode GE1 while interposing the first insulating thin layer 12 therebetween. The input electrode SE1 (hereinafter, referred to as a first input electrode) and the output electrode DE1 (hereinafter, referred to as a first output electrode) of the first transistor TFT1 are disposed to overlap with the first semiconductor AL1. The first input electrode SE1 and the first output electrode DE1 are spaced apart from each other. In FIGS. 4 and 5, the first transistor TFT1 having a bottom gate structure has been shown, but the first transistor TFT1 should not be limited to the bottom gate structure. That is, the first transistor TFT1 may have a top gate structure.

The first electrode CE1 of the capacitor Cap is disposed on the first insulating thin layer 12. The first electrode CE1 of the capacitor Cap is connected to the first output electrode DE1. A second insulating thin layer 14 is disposed on the first insulating thin layer 12 to cover the first input electrode SE1, the first output electrode DE1, and the first electrode CE1 of the capacitor Cap. The second electrode CE2 of the capacitor Cap is disposed on the second insulating thin layer 14. The second electrode CE2 is connected to the source voltage line KL.

Referring to FIGS. 4 and 6, the control electrode GE2 (hereinafter, referred to as a second control electrode) of the second transistor TFT2 is connected to the first electrode CE1 of the capacitor Cap. A semiconductor layer AL2 (hereinafter, referred to as a second semiconductor layer) of the second transistor TFT2 is disposed on the second control electrode GE2 while interposing the first insulating thin layer 12 therebetween. The input electrode SE2 (hereinafter, referred to as a second input electrode) and the output electrode DE2 (hereinafter, referred to as a second output electrode) of the second transistor TFT2 are disposed to overlap with the second semiconductor layer AL2. The second input electrode SE2 and the second output electrode DE2 are spaced apart from each other. The second insulating thin layer 14 covers the second input electrode SE2 and the second output electrode DE2. Different from the structure shown in FIGS. 4 and 6, the second transistor TFT2 may have a top gate structure.

The organic light emitting diode OLED(3, i) is disposed on the second insulating thin layer 14. The organic light emitting diode OLED(3, i) includes a first electrode AE, a hole injection layer HIL, a hole transport layer HTL, the organic light emitting layer EML, an electron injection layer EIL, and a second electrode CE. The first electrode AE is connected to the second output electrode DE2 through a contact hole TH formed penetrating through the second insulating thin layer 14.

The structure of the organic light emitting diode OLED(3, i) should not be limited to the above-mentioned structure. The electron injection layer EIL may be omitted, and the organic light emitting diode OLED(3, i) may further include an electron transport layer ETL disposed between the organic light emitting layer EML and the electron injection layer EIL.

The organic light emitting display panel DP may include an additional base substrate facing the base substrate 10. The additional base substrate may be, but not limited to, a sealing substrate to protect the pixels PX(1, 1) to PX(n, m).

Figure 7:
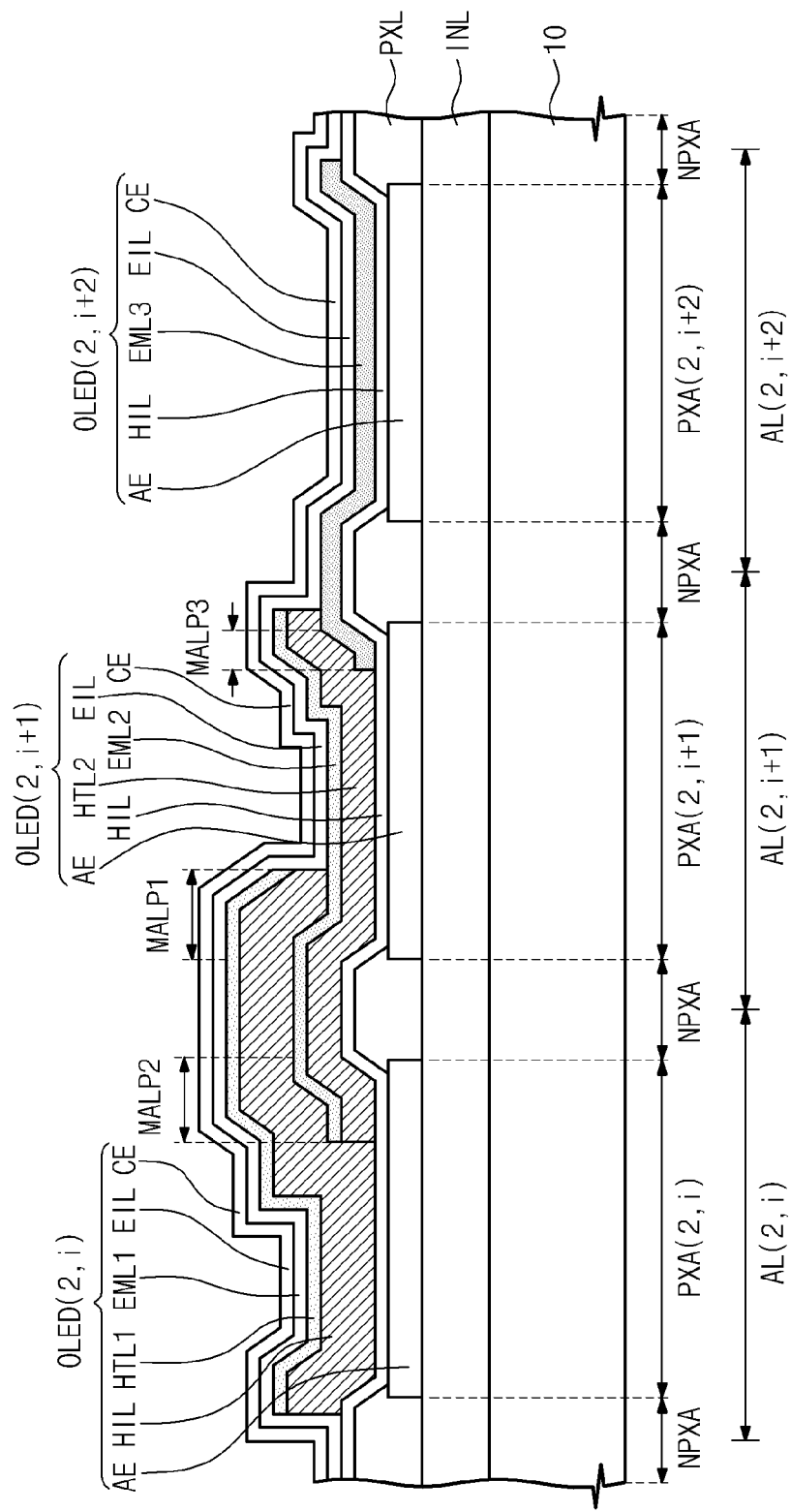
FIG. 7 is a cross-sectional view taken along a line K-K' of FIG. 3.

FIG. 7 is a cross-sectional view taken along a line K-K' of FIG. 3. FIG. 7 shows the cross-sectional view of three light emitting areas PXA(2, i) to PXA(2, i+2) (hereinafter, referred to as first to third light emitting areas), which are successively arranged in the first direction DR1. In the first to third light emitting areas PXA(2, i) to PXA(2, i+2), the organic light emitting diodes OLED(2, i) to (2, i+2) (hereinafter, referred to as first to third organic light emitting diodes) corresponding to the pixels PX(2, i) to PX(2, i+2) (hereinafter, referred to as first to third pixels) are respectively disposed.

The first to third organic light emitting diodes OLED(2, i) to OLED(2, i+2) may generate lights having different colors from each other. For instance, the first to third organic light emitting diodes OLED(2, i) to OLED(2, i+2) generate red, green, and blue lights, respectively.

The organic light emitting display panel DP may further include a fourth pixel disposed adjacent to the first to third pixels PX(2, i) to PX(2, i+2) to generate a light having a different color from the red, green, and blue lights. As an example, the fourth pixel may generate a white light. The organic light emitting diode of the fourth pixel may be disposed at a right side of the third light emitting area PXA(2, i+2) in FIG. 7.

Referring to FIG. 7, an insulating layer INL is disposed on the base substrate 10. The insulating layer INL may include a plurality of thin layers as described with reference to FIGS. 5 and 6. The first electrodes AE of the first to third organic light emitting diodes OLED(2, i) to OLED(2, i+2) are disposed on the insulating layer INL. The first electrodes AE are respectively disposed in the first to third light emitting areas PXA(2, i) to PXA(2, i+2).

In one embodiment, the first electrodes AE are anode electrodes of the first to third organic light emitting diodes OLED(2, i) to OLED(2, i+2). The first electrodes AE are formed of a material with high conductivity and work function. The first electrodes AE include a metal material to reflect the light to the common electrode CE. The first electrode AE may include indium tin oxide, indium zinc oxide, tin oxide, or zinc oxide.

The pixel definition layer PXL is disposed on the insulating layer INL. The first electrodes AE are exposed through the opening portions OP(2, i) to OP(2, i+2) of the pixel definition layer PXL. However, the pixel definition layer PXL may be omitted in some embodiments.

The hole injection layer HIL is disposed in the first to third light emitting areas PXA(2, i) to PXA(2, i+2) of the base substrate 10. The hole injection layer HIL covers the pixel definition layer PXL and makes contact with each first electrode AE. The hole injection layer HIL of the first to third organic light emitting diodes OLED(2, i) to OLED(2, i+2) is integrally formed as a single unitary and individual unit.

The hole injection layer HIL injects holes into the first to third organic light emitting diodes OLED(2, i) to OLED(2, i+2) from the first electrodes AE. The hole injection layer HIL may include phthalocyanine (Pc), 4,4',4"-tris(N-(2-naphthyl)-N-phenylamino)triphenylamine (2-TNATA), 4,4',4"-tris (N-(3-methylphenyl) N-phenylamino) triphenylamine (m-MTDATA), polyaniline, olygothiophene, and the like.

The hole transport layer HTL1 (hereinafter, referred to as a first hole transport layer) of the first organic light emitting diode OLED(2, i) is disposed on the hole injection layer HIL in the first light emitting area PXA(2, i). The organic light emitting layer EML1 (hereinafter, referred to as a first light emitting layer) of the first organic light emitting diode OLED(2, i) is disposed on the first hole transport layer HTL1.

The hole transport layer HTL2 (hereinafter, referred to as a second hole transport layer) of the second organic light emitting diode OLED(2, i+1) is disposed on the hole injection layer HIL in the second light emitting area PXA(2, i+1). The organic light emitting layer EML2 (hereinafter, referred to as a second light emitting layer) of the second organic light emitting diode OLED(2, i+1) is disposed on the second hole transport layer HTL2.

The hole transport layer HTL3 (hereinafter, referred to as a third hole transport layer) of the third organic light emitting diode OLED(2, i+2) is disposed on the hole injection layer HIL in the third light emitting area PXA(2, i+2). In one embodiment, the third organic light emitting diode OLED(2, i+2) does not include the hole transport layer.

The first light emitting layer EML1, the second light emitting layer EML2, and the third light emitting layer EML3 include a host material and a dopant. The first, second, and third light emitting layers EML1, EML2, and EML3 may include different host materials and different dopants to generate lights having different colors from each other.

The first and second hole transport layers HTL1 and HTL2 transport the holes to the first and second light emitting layers EML1 and EML2 from the hole injection layer HIL, respectively. The first and second hole transport layers HTL1 and HTL2 include benzidine derivatives, such as, for example, TPD, α-NPD, and the like, or triphenylamine polymer.

The first and second hole transport layers HTL1 and HTL2 have different thicknesses from each other. The first and second hole transport layers HTL1 and HTL2 control a resonance of the light generated by the first organic light emitting diode OLED(2, i) and the second organic light emitting diode OLED(2, i+1). Since an optical resonance thickness required to maximize a light emission depends on a wavelength of the light, the first and second hole transport layers HTL1 and HTL2 have different thicknesses from each other. In one embodiment, the light generated in the third pixel PX(2, i+2) has maximum resonance effect when the third pixel PX(2, i+2) does not include the hole transport layer.

The electron injection layer EIL and the common electrode CE are successively arranged on the first, second, and third light emitting layers EML1, EML2, and EML3. The electron injection layer EIL and the common electrode CE are disposed in the first to third light emitting areas PXA(2, i) to PXA(2, i+2) and the non-light emitting area NPXA. The electron injection layer EIL and the common electrode CE are integrally formed with each other. The electron injection layer EIL includes alumiquinolinol complex (Alq3:TFTis(8-quinolinolato)aluminum), lithium fluoride (LiF), oxydiazole derivatives (PBD).

The common electrode CE s is described herein as a cathode electrode of the first to third organic light emitting diodes OLED(2, i) to OLED(2, i+2). The common electrode CE includes a transparent conductive material, such as, for example, indium tin oxide, indium zinc oxide, tin oxide, or zinc oxide, to transmit the light generated from the first and second light emitting layers EML1 and EML2. The common electrode CE may alternatively include a metal material to reflect the light.

As shown in FIG. 7, the first hole transport layer HTL1 and the first light emitting layer EML1 are misaligned with respect to the first light emitting area PXA(2, i). The first hole transport layer HTL1 and the second light emitting layer EML2 are shifted to a more right direction than a normal position AL(2, i). In the normal position, the hole transport layer and the light emitting layer are not interfered by adjacent light emitting areas. Both end portions of the hole transport layer and the light emitting layer, which are located at the normal position, are disposed in the non-light emitting area NPXA.

The second hole transport layer HTL2 and the second light emitting layer EML2 are misaligned with respect to the second light emitting area PXA(2, i+1). The second hole transport layer HTL2 and the second light emitting layer EML2 are shifted to a more left direction than the normal position AL(2, i+1).

The misalignment of the first light emitting diode OLED(2, i) and the second light emitting diode OLED(2, i+1) is caused by an misalignment of a mask generated when the organic light emitting display panel is manufactured. This will be described in detail with reference to FIGS. 8A to 8J.

A portion MALP1 (hereinafter, referred to as a first interference portion) of the first hole transport layer HTL1 and the first light emitting layer EML1 is disposed on the hole injection layer HIL of the second light emitting area PXA(2, i+1). A portion MALP2 (hereinafter, referred to as a second interference portion) of the second hole transport layer HTL2 and the second light emitting layer EML2 is disposed on the hole injection layer HIL of the first light emitting area PXA(2, i).

The second interference portion MALP2 makes contact with the hole injection layer HIL of the first light emitting area PXA(2, i) and the first interference portion MALP1 makes contact with the second light emitting layer EML2 of the second light emitting area PXA(2, i+1). According to another embodiment, the first interference portion MALP1 makes contact with the hole injection layer HIL of the second light emitting area PXA(2, i+1) and the second interference portion MALP2 makes contact with the first light emitting layer EML1 of the first light emitting area PXA(2, i) according to the stack order of the above-mentioned layers.

Although the second interference portion MALP2 is disposed in the first light emitting area PXA(2, i), the light is not emitted from the second interference portion MALP2. This is because the first light emitting layer EML1 and the first hole transport layer HTL1, which are disposed on the second interference portion MALP2, block the electrons from moving to the second interference portion MALP2 from the common electrode CE. On the other hand, the holes are recombined with the electrons in the first light emitting layer EML1, and thus the light is generated in the first pixel PX(2, i).

When the second light emitting layer EML2 of the second interference portion MALP2 is disposed between the first light emitting layer EML1 and the first hole transport layer HTL1, the first and second light emitting layers EML1 and EML2 emit the lights. That is, the lights having different colors are mixed with each other in the first light emitting area PXA(2, i). As described above, the first hole transport layer HTL1 and the first light emitting layer EML1 are successively arranged and the second hole transport layer HTL2 and the second light emitting layer EML2 are successively arranged, the lights having different colors may be prevented from being mixed with each other.

Although the first interference portion MALP1 is disposed in the second light emitting area PXA(2, i+1), the light is not emitted in the first interference portion MALP1. Since the holes are recombined with the electrons in the second light emitting layer EML2 disposed under the first interference portion MALP1, a density of the holes provided to the first interference portion MALP1 is very low. On the other hand, the holes are recombined with the electrons in the second light emitting layer EML2, and thus the light is generated in the second pixel PX(2, i+1).

As shown in FIG. 7, the third light emitting layer EML3 is misaligned with respect to the third light emitting area PXA(2, i+2). The third light emitting layer EML3 is shifted to a more left direction than the normal position AL(2, i+2). Accordingly, a portion MALP3 (hereinafter, referred to as a third interference portion) of the third light emitting layer EML3 is disposed on the hole transport layer HIL of the second light emitting area PXA(2, i+1). The third interference portion MALP3 makes contact with the hole injection layer HIL of the second light emitting area PXA(2, i+1).

Although the third interference portion MALP3 is disposed in the second light emitting area PXA(2, i+1), the light is not emitted from the third interference portion MALP3. This is because the second light emitting layer EML2 and the second hole transport layer HTL2, which are disposed on the third interference portion MALP3, block the electrons from moving to the third interference portion MALP3.

As shown in FIG. 7, the second hole transport layer HTL2 and the second light emitting layer EML2 may be shifted to the right direction compared to the normal position AL(2, i+1). In this case, portions of the second hole transport layer HTL2 and the second light emitting layer EML2 are disposed on the hole transport layer HIL of the third light emitting area PXA(2, i+2). The light is not emitted in the portion of the second light emitting layer EML2 disposed in the third light emitting area PXA(2, i+2). This is because the density of the holes provided to the second light emitting layer EML2 is very low. In addition, it is enough that the organic light emitting display panel DP according to an embodiment includes any one of the first to third interference portions MALP1 to MALP3.

FIGS. 8A to 8J are cross-sectional views showing a method of manufacturing the organic light emitting display panel according to an embodiment of the present disclosure. In reference to FIGS. 8A to 8J, the three successive light emitting areas PXA(2, i) to PXA(2, i+2) (hereinafter, referred to as first to third light emitting areas) are described.

Figure 8A:
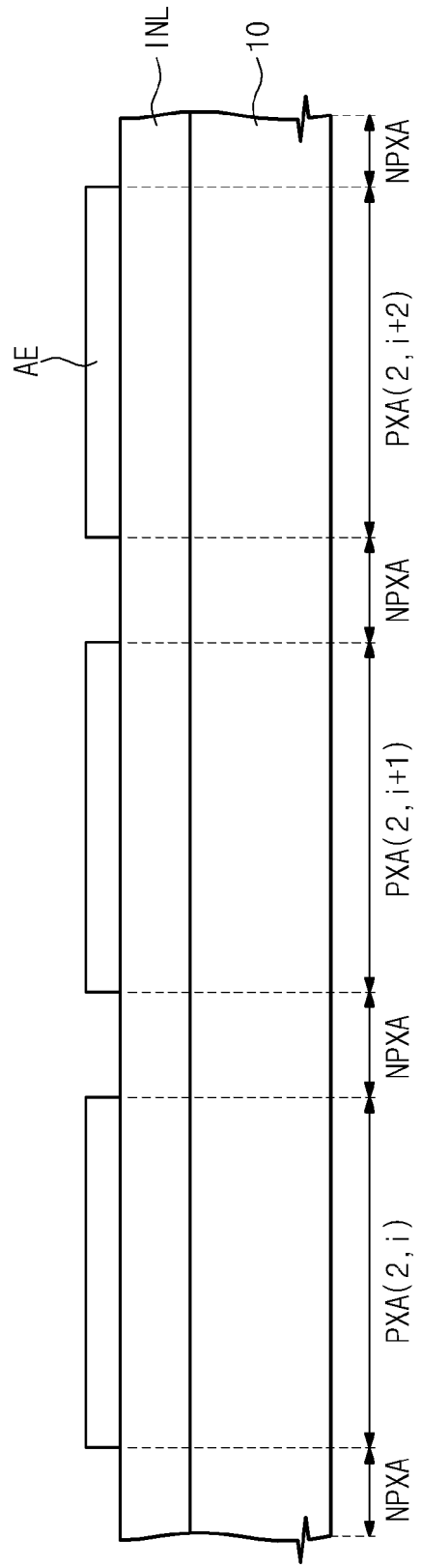

Referring to FIG. 8A, the first electrodes AE are formed in the first to third light emitting areas PXA(2, i) to PXA(2, i+2) of the base substrate 10. The first electrodes AE are formed on the insulating layer INL disposed on the base substrate 10. To this end, an electrode layer is formed on the insulating layer INL and the electrode layer is patterned. In addition, the first electrodes AE may be formed by an inkjet printing method or a nozzle printing method.

The insulating layer INL may include a plurality of thin layers sequentially stacked one on another. Before the first electrodes AE are formed, thin film transistors and capacitors may be formed on the base substrate 10. The thin film transistors and the capacitors are formed by deposition, exposure, and development processes. A portion of the thin layers for the insulating layer INL is used to form the thin film transistors or the capacitors.

Figure 8B:
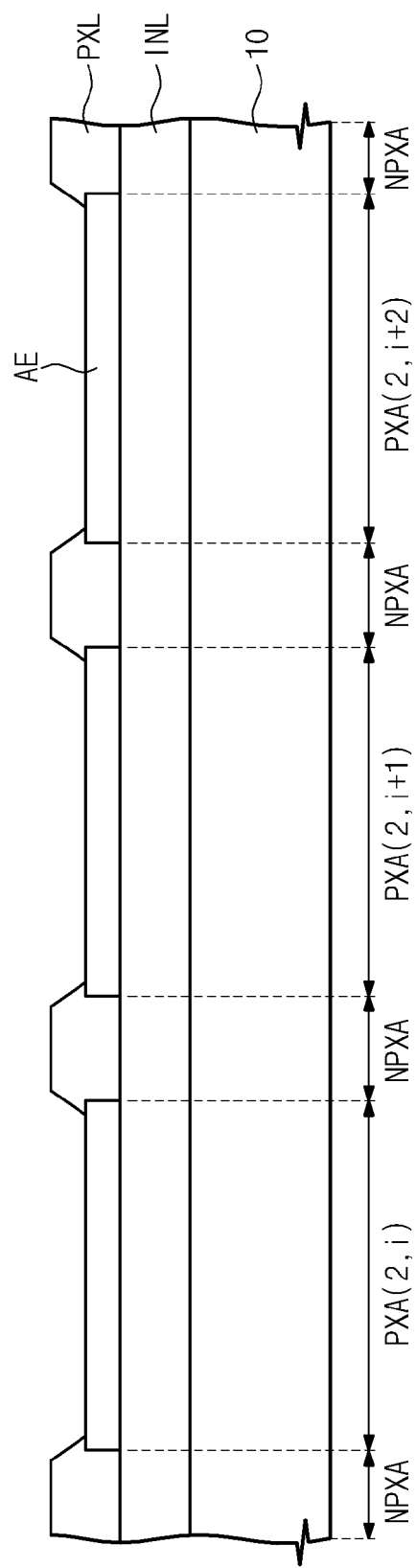

Referring to FIG. 8B, the pixel definition layer PXL is formed on the insulating layer INL. The pixel definition layer PXL is provided with the openings OP(2, i) to OP(2, i+2) formed therethrough to expose the first electrodes AE.

The pixel definition layer PXL is formed by forming a base layer (not shown) that covers the first electrodes AE and patterning the base layer using exposure and development processes. Portions, which are removed from the base layer, correspond to the openings OP(2, i) to OP(2, i+2). The pixel definition layer PXL may be omitted.

Figure 8C:
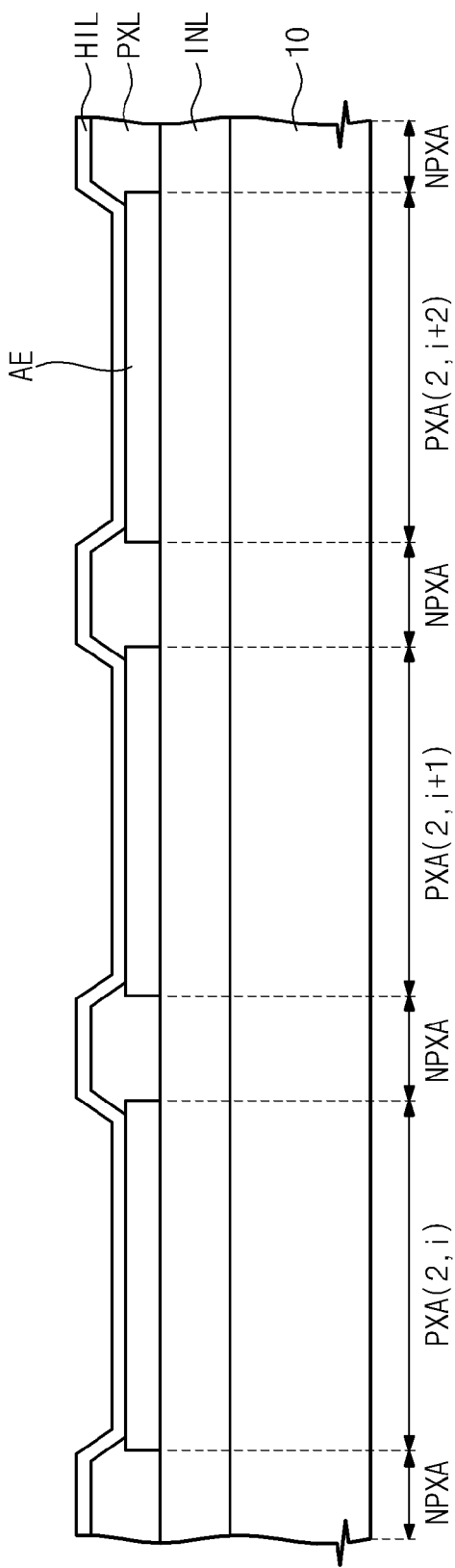

Referring to FIG. 8C, the hole injection layer HIL is formed on the base substrate 10. The hole injection layer HIL makes contact with the first electrodes AE and covers the pixel definition layer PXL. The hole injection layer HIL may be formed by a chemical vapor deposition method, a thermal deposition method, or using a sputtering apparatus. In addition, the hole injection layer HIL may be formed by an inkjet coating method, a nozzle coating method, a spin coating method, a gravia coating method, or a spray coating method.

Figure 8D:
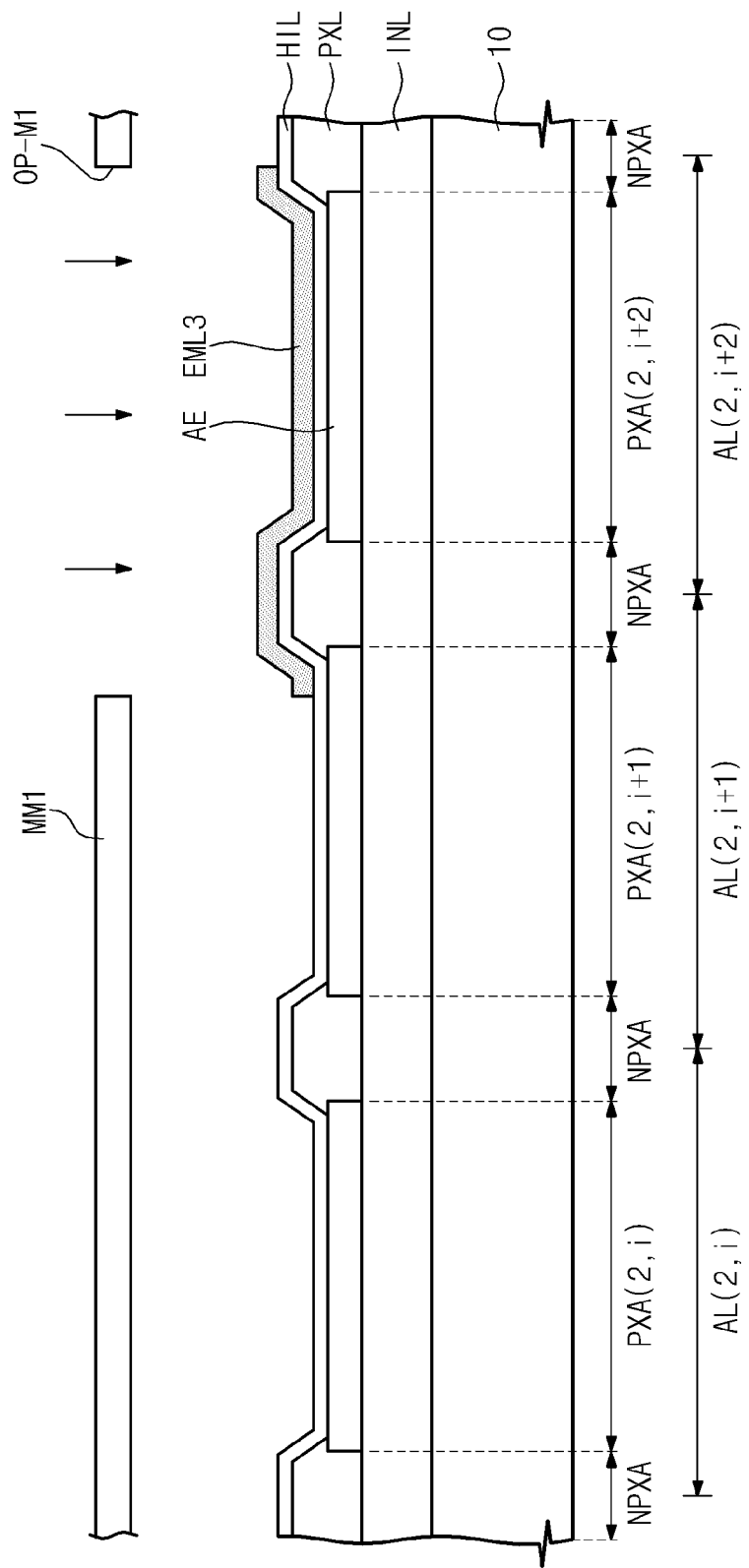

Referring to FIG. 8D, the third light emitting layer EML3 is formed to overlap with the hole injection layer HIL of the third light emitting area PXA(2, i+2). A mask MM1 provided with a first deposition opening OP-M1 is disposed on the hole injection layer HIL. A light emitting material is deposited on the hole injection layer HIL of the third light emitting area PXA(2, i+2) through the first deposition opening OP-M1.

A portion of the third light emitting layer EML3 is disposed in the second light emitting area PXA(2, i+2) due to the misalignment between the mask MM1 and the base substrate 10. In other words, when the first deposition opening OP-M1 is shifted to more left direction than the normal position AL(2, i+2), the third light emitting layer EML3 is shifted to the left direction.

The third light emitting layer EML3 is formed prior to the first hole transport layer HTL1 (refer to FIG. 7) and the second hole transport layer HTL2 (refer to FIG. 7). This is to prevent the portion of the third light emitting layer EML3 from being interfered between the first hole transport layer HTL1 and the first light emitting layer EML1 or between the second hole transport layer HTL2 and the second light emitting layer EML2 due to the misalignment. In addition, this is to prevent the portion of the third light emitting layer EML3 from being interfered between the first light emitting layer EML1 and the electron injection layer EIL (refer to FIG. 7) or between the second light emitting layer EML2 and the electron injection layer EIL (refer to FIG. 7).

Then, as shown in FIG. 8E, the second hole transport layer HTL2 is formed to overlap with the hole injection layer HIL of the second light emitting area PXA(2, i+1). The second hole transport layer HTL2 is formed by a deposition process using a mask MM2. Due to the misalignment of the mask MM2, the second hole transport layer HTL2 is shifted to more left direction than the normal position AL(2, i+1).

Referring to FIG. 8F, the second light emitting layer EML2 is formed in the second light emitting area PXA(2, i+1). The second light emitting layer EML2 is formed by a deposition process using a mask MM3. Due to the misalignment of the mask MM3, the second light emitting layer EML2 disposed on the second hole transport layer HTL2 is shifted more than the normal position AL(2, i+1). Different from the structure shown in FIG. 8F, a shifted length and a shifted direction of the second light emitting layer EML2 may be different from those of the second hole transport layer HTL2.

As described with reference to FIGS. 8E and 8F, when the second hole transport layer HTL2 and the second light emitting layer EML2 are successively stacked, the second light emitting layer EML2 does not make contact with the first light emitting layer EML1. Different from the structure shown in FIGS. 8E and 8F, when the second hole transport layer HTL2 is shifted to the right direction, the second light emitting layer EML2 does not make contact with the third light emitting layer EML3 of the third light emitting area PXA(2, i+2).

Figure 8H:
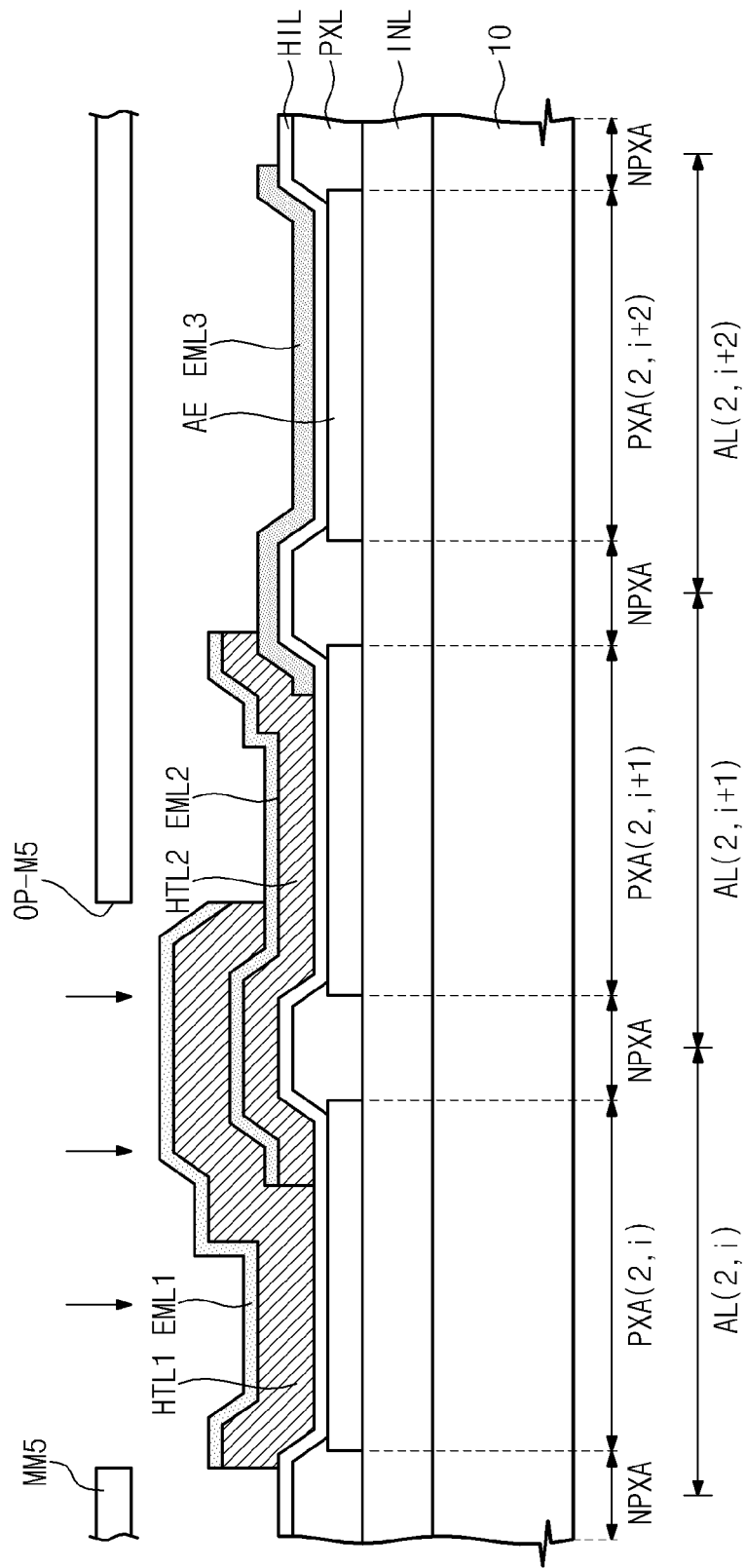

Referring to FIGS. 8G and 8H, the first hole transport layer HTL1 and the first light emitting layer EML1, which are overlapped with the hole injection layer HIL of the first light emitting area PXA(2, i), are successively formed through deposition processes using masks MM4 and MM5. Each of the first hole transport layer HTL1 and the first light emitting layer EML1 is formed by the above-mentioned deposition process. The first hole transport layer HTL1 and the first light emitting layer EML1 shown in FIGS. 8G and 8H are shifted to more right direction than the normal position AL(2, i).

Meanwhile, the first hole transport layer HTL1 and the first light emitting layer EML1 may be formed prior to the second hole transport layer HTL2 and the second light emitting layer EML2. In one embodiment, it is enough that the first hole transport layer HTL1 and the first light emitting layer EML1 are successively formed and the second hole transport layer HTL2 and the second light emitting layer EML2 are successively formed.

Referring to FIG. 8I, the electron injection layer EIL is formed on the first to third light emitting layers EML1 to EML3 and the non-light emitting area NPXA. The electron injection layer EIL may be formed by a chemical vapor deposition method, a thermal deposition method, or using a sputtering apparatus. In addition, the electron injection layer EIL may be formed by an inkjet coating method, a nozzle coating method, a spin coating method, a gravia coating method, or a spray coating method.

According to another embodiment, the electron injection layer EIL may be omitted. In addition, according to another embodiment, the electron transport layer may be formed on the first to third light emitting layers EML1 to EML3 before the electron injection layer EIL is formed. In this case, the electron injection layer EIL is formed on the electron transport layer.

Figure 8J:
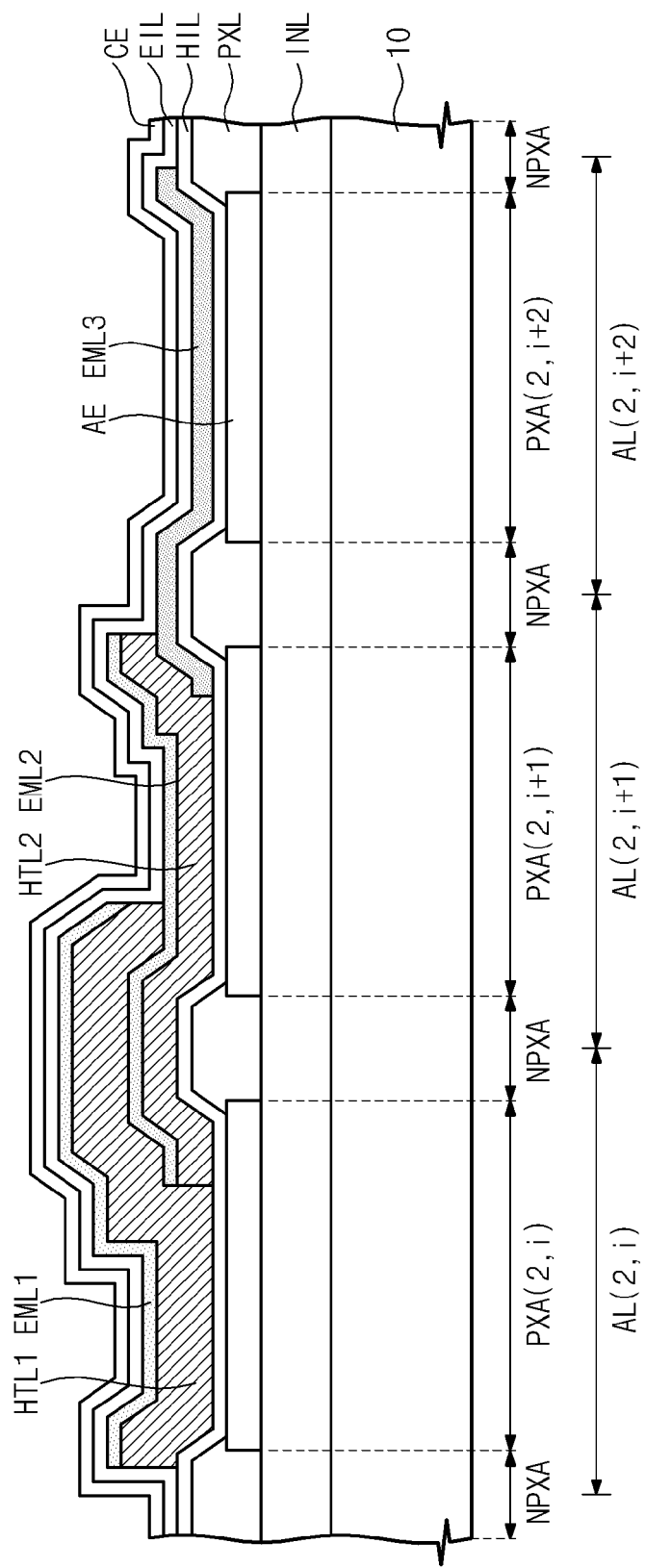

Referring to FIG. 8J, the common electrode CE is formed on the electron injection layer EIL. The common electrode CE may be formed by a wet etch method, such as, for example, a printing method, a coating method, etc., or a dry etch method, e.g., a vacuum deposition method, a sputtering method, an ion plating method, a chemical vapor deposition method, a plasma deposition method, etc.

Figure 9:
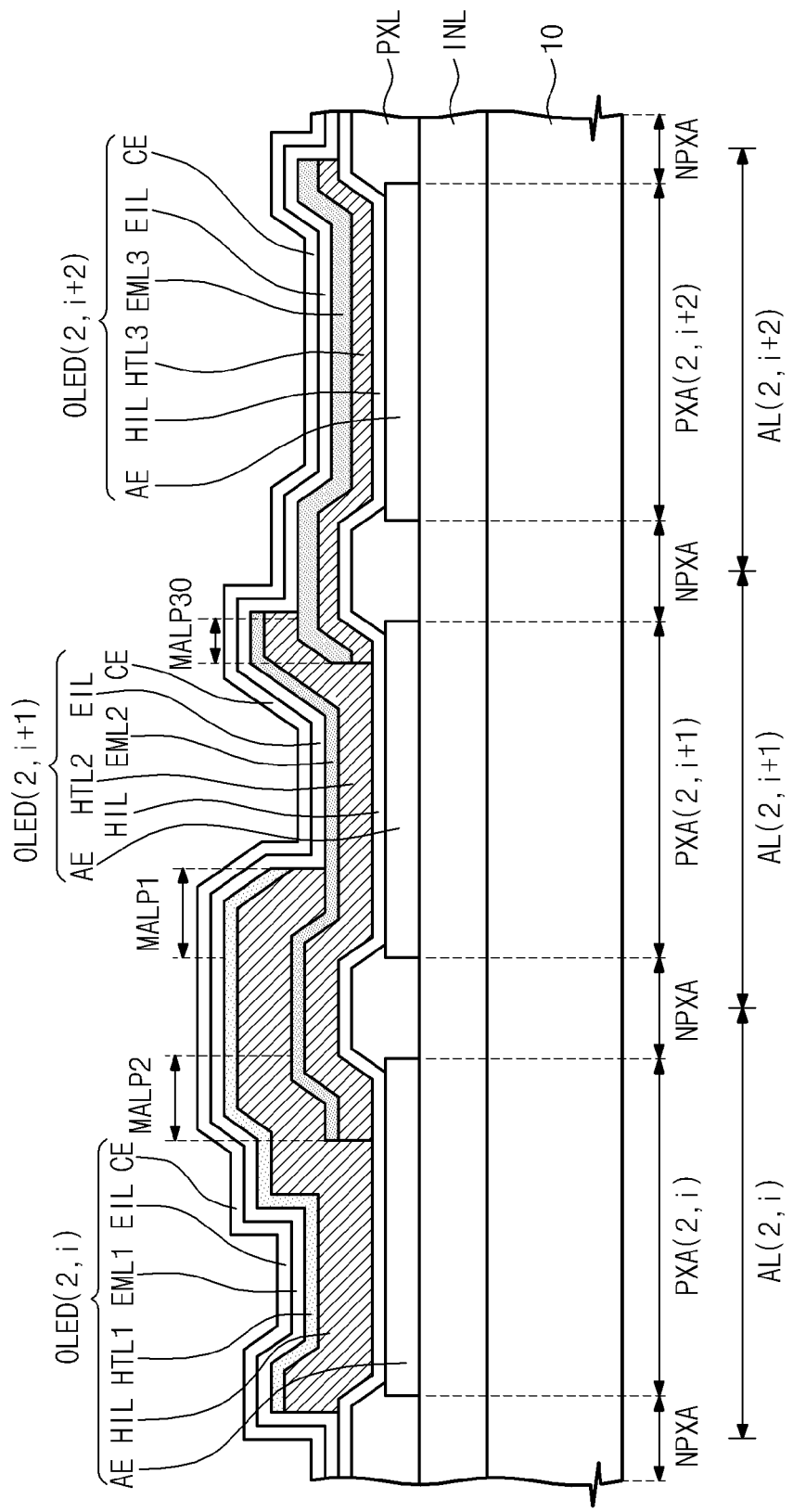
FIG. 9 is a cross-sectional view showing an organic light emitting display panel according to an embodiment of the present disclosure.

FIG. 9 is a cross-sectional view showing an organic light emitting display panel according to an embodiment of the present disclosure. In FIG. 9, detailed descriptions of the same elements as those in FIG. 7 will be omitted.

Referring to FIG. 9, a third organic light emitting diode OLED(2, i+2) disposed in a third light emitting area PXA(2, i+2) further includes a third hole transport layer HTL3. The third hole transport layer HTL3 includes benzidine derivatives, such as, for example, TPD, α-NPD, and the like, or triphenylamine polymer.

The third hole transport layer HTL3 has an optical resonance thickness to allow an emission of a light generated in the third organic light emitting diode OLED(2, i+2) to be maximized. The third hole transport layer HTL3 has a thickness different from that of the first hole transport layer HTL1 and the second hole transport layer HTL2.

As shown in FIG. 9, the third hole transport layer HTL3 and the third light emitting layer EML3 are misaligned with respect to the third light emitting area PXA(2, i+2). The third hole transport layer HTL3 and the third light emitting layer EML3 are shifted to a more left direction than the normal position AL(2, i+2) of the third light emitting area PXA(2, i+2). Thus, a portion MALP30 (hereinafter, referred to as a third interference portion) of the third hole transport layer HTL3 and the third light emitting layer EML3 are disposed on the hole injection layer HIL of the second light emitting area PXA(2, i+1).

Although the third interference portion MALP30 is disposed on the second light emitting area PXA(2, i+1), the light is not emitted from the third interference portion MALP30. This is because the second light emitting layer EML2 and the second hole transport layer HTL2, which are disposed on the third interference portion MALP30, block the electrons from moving to the third interference portion MALP30.

The third hole transport layer HTL3 is formed prior to the third light emitting layer EML3. As described with reference to FIG. 8D, the third hole transport layer HTL3 is formed by a deposition process using a mask. The third hole transport layer HTL3 is caused by the misalignment of the third hole transport layer HTL3.

After the third hole transport layer HTL3 is formed in the third light emitting area PXA(2, i+2), the third light emitting layer EML3 is successively formed on the third hole transport layer HTL3. Then, the processes described with reference to FIGS. 8E to 8J are performed, and thus the organic light emitting display panel shown in FIG. 9 is manufactured.

FIG. 10 is a cross-sectional view showing an organic light emitting display panel according to an embodiment of the present disclosure. In FIG. 10, detailed descriptions of the same elements as those in FIG. 9 will be omitted.

Referring to FIG. 10, a third organic light emitting diode OLED(2, i+2) disposed in a third light emitting area PXA(2, i+2) includes a third hole transport layer HTL3 and a third light emitting layer EML3, which are successively stacked. The third hole transport layer HTL3 and the third light emitting layer EML3 are shifted to a more left direction than the normal position AL(2, i+2) of the third light emitting area PXA(2, i+2).

A portion MALP300 (hereinafter, referred to as a third interference portion) of the third hole transport layer HTL3 and the third light emitting layer EML3 is disposed on the hole injection layer HIL of the second light emitting area PXA(2, i+1). The third interference portion MALP300 makes contact with the second light emitting layer EML2. The light is not emitted from the third interference portion MALP300. This is because a density of the holes provided to the portion of the third interference portion MALP300 is very low.

The third hole transport layer HTL3 and the third light emitting layer EML3 are successively formed after the second hole transport layer HTL2 and the second light emitting layer EML2 are formed. The third hole transport layer HTL3 and the third light emitting layer EML3 may be formed after the first hole transport layer HTL1 and the third light emitting layer EML3 are formed. Then, as described with reference to FIGS. 8I and 8J, the electron injection layer EIL and the common electrode CE are successively formed. As a result, the organic light emitting display panel shown in FIG. 10 is manufactured.

Although certain embodiments of the present invention have been described, it is understood that the present invention should not be limited to these embodiments but various changes and modifications can be made by one ordinary skilled in the art within the spirit and scope of the present invention as hereinafter claimed.

What is claimed is:

1. An organic light emitting display panel comprising:
   a base substrate comprising a plurality of light emitting areas and a non-light emitting area surrounding the light emitting areas;
   a first electrode disposed in a first light emitting area of the plurality of light emitting areas;
   a second electrode disposed in a second light emitting area of the plurality of light emitting areas, wherein the second light emitting area is adjacent to the first light emitting area;
   a hole injection layer contacting the first electrode and the second electrode, and disposed to overlap with the first and second light emitting areas and the non-light emitting area;
   a first hole transport layer disposed over the hole injection layer disposed in the first light emitting area;
   a first light emitting layer disposed on the first hole transport layer contacting the first hole transport layer;
   a second hole transport layer disposed over the hole injection layer disposed in the second light emitting area;
   a second light emitting layer disposed on the second hole transport layer contacting the second hole transport layer; and
   a common electrode disposed on the first light emitting layer and the second light emitting layer to overlap with the plurality of light emitting areas and the non-light emitting area,
   wherein a portion of the first hole transport layer and a portion of the second hole transport layer are overlapped and
   wherein a portion of the first hole transport layer and a portion of the first light emitting layer are disposed over the hole injection layer in the second light emitting area.

2. The organic light emitting display panel of claim 1, wherein a portion of the second hole transport layer and a portion of the second light emitting layer are disposed over the first light emitting layer in the first light emitting area.

3. The organic light emitting display panel of claim 2, further comprising:
   a third electrode disposed in a third light emitting area of the plurality of light emitting areas, the third light emitting area adjacent to the first light emitting area, wherein the third electrode is disposed between the base substrate and the hole injection layer in the third light emitting area; and
   a third light emitting layer disposed over the hole injection layer disposed in the third light emitting area.

4. The organic light emitting display panel of claim 3, wherein a portion of the third light emitting layer contacts the hole injection layer in the first light emitting area.

5. The organic light emitting display panel of claim 4, wherein another portion of the first hole transport layer and another portion of the first light emitting layer are disposed on the third light emitting layer in the third light emitting area.

6. The organic light emitting display panel of claim 3, further comprising a third hole transport layer disposed between the third light emitting layer and the hole injection layer in the third light emitting area, wherein the third hole transport layer contacts the third light emitting layer.

7. The organic light emitting display panel of claim 6, wherein a portion of the third hole transport layer contacts the hole injection layer in the first light emitting area, and a portion of the third light emitting layer contacts the portion of the third hole transport layer.

8. The organic light emitting display panel of claim 7, wherein another portion of the first hole transport layer and another portion of the first light emitting layer are disposed over the third light emitting layer disposed in the third light emitting area.

9. The organic light emitting display panel of claim 6, wherein a portion of the third hole transport layer contacting the first light emitting layer and a portion of the third light emitting layer overlaps the portion of the third hole transport layer.

10. The organic light emitting display panel of claim 9, wherein another portion of the first hole transport layer contacts the hole injection layer in the third light emitting area, and another portion of the first light emitting layer contacts the another portion of the third light emitting layer.

11. The organic light emitting display panel of claim 1, further comprising a pixel definition layer disposed under the hole injection layer and provided with openings respectively exposing the first electrode and the second electrode.

12. The organic light emitting display panel of claim 1, wherein the first hole transport layer and the second hole transport layer have different thicknesses from each other.

13. The organic light emitting display panel of claim 1, further comprising a first electron injection layer disposed between the common electrode and the first light emitting layer and a second electron injection layer disposed between the common electrode and the second light emitting layer.

14. The organic light emitting display panel of claim 13, further comprising a first electron transport layer disposed between the electron injection layer and the first light emitting layer and a second electron transport layer disposed between the electron injection layer and the second light emitting layer.

* * * * *

UNITED STATES PATENT AND TRADEMARK OFFICE
CERTIFICATE OF CORRECTION

PATENT NO. : 8,952,370 B2
APPLICATION NO. : 13/938771
DATED : February 10, 2015
INVENTOR(S) : Jae Jung Kim et al.

Page 1 of 1

It is certified that error appears in the above-identified patent and that said Letters Patent is hereby corrected as shown below:

In the specification

At column 5, line 28, please delete "TFT 1" and insert --TFT1--, therefor.

At column 5, line 30, please delete "TFT 1" and insert --TFT1--, therefor.

At column 6, line 16, please delete "II-IF" and insert --II-II'--, therefor

At column 8, line 14, please delete "olygothiophene," and insert --oligothiophene,--, therefor.

At column 9, line 1, please delete "TFTis(8-" and insert --TFT is(8- --, therefor.

At column 11, line 23, please delete "gravia" and insert --gravure--, therefor.

At column 12, line 36, please delete "gravia" and insert --gravure--, therefor.

Signed and Sealed this
Seventeenth Day of November, 2015

Michelle K. Lee
*Director of the United States Patent and Trademark Office*